United States Patent
Na et al.

(10) Patent No.: US 8,896,083 B2
(45) Date of Patent: Nov. 25, 2014

(54) DEPLETION-MODE FIELD-EFFECT TRANSISTOR-BASED PHOTOTRANSITOR

(71) Applicant: Semiconductor Research Corporation, Research Triangle Park, NC (US)

(72) Inventors: Yeul Na, Santa Clara, CA (US); Krishna C. Saraswat, Saratoga, CA (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 13/835,662

(22) Filed: Mar. 15, 2013

(65) Prior Publication Data

US 2014/0264501 A1    Sep. 18, 2014

(51) Int. Cl.
*H01L 31/06* (2012.01)
*H01L 31/18* (2006.01)
*H01L 31/0224* (2006.01)
*H01L 31/062* (2012.01)

(52) U.S. Cl.
CPC .............. *H01L 31/062* (2013.01); *H01L 31/18* (2013.01); *H01L 31/022408* (2013.01)
USPC ............ 257/462; 257/187; 257/257; 257/291

(58) Field of Classification Search
USPC .................. 257/462, 187, 257, 291
See application file for complete search history.

(56) References Cited

U.S. PATENT DOCUMENTS 5,528,059 A * 6/1996 Isogai ........................ 257/187

* cited by examiner

*Primary Examiner* — Long Pham
(74) *Attorney, Agent, or Firm* — Antony P. Ng; Russell Ng PLLC (57) ABSTRACT

A depletion-mode phototransitor is disclosed. The phototransistor having a substrate, a gate, a source, a drain and a channel. The source, drain and channel are doped to be the same type of semiconductor. The substrate can be made of silicon and/or germanium. The gate can be made of either aluminum or polysilicon.

16 Claims, 8 Drawing Sheets

DEPLETION-MODE FIELD-EFFECT TRANSISTOR-BASED PHOTOTRANSITOR

BACKGROUND OF THE INVENTION

1. Technical Field

The present invention relates to phototransistors in general, and in particular to a depletion-mode field-effect transistor-based phototransistor.

2. Description of Related Art

While the scaling down of dimensions of electronic devices has provided dramatic improvements in their performance, on-chip/off-chip interconnects have become a major performance bottleneck because the scaling also reduces cross-sectional dimensions. As a result, conventional schemes for metal interconnects become problematic in terms of latency, bandwidth and power.

The usage of optical interconnects can avoid the resistive loss and capacitive physics of metal interconnects. Optical interconnects can also help to meet the latency and bandwidth requirements. However, the energy per bit of the optical interconnects is still too high compared to that of their metal counterparts except for long wires. While some modulator schemes promise to satisfy power requirements for on-chip interconnects, lasers and receiver circuits still have technological problems. These problems are inherent in photodiodes that are commonly used as photodetectors in optical receiver circuits. Because of the diffraction limit of light, a photodiode is not scalable, and therefore a device with sub-wavelength dimensions suffers from reduced responsivity. In addition, photodiodes have a much larger footprints than many electronic devices, which may lead to large output capacitances, large dark currents, and high power consumption in receiver circuits.

In addition, typical photodiodes have a theoretical limit on the external quantum efficiency (EQE) of 1, or a responsivity of ~0.7 A/W at 850 nm wavelength. This limitation and the large dark current require a high optical input signal in order to maintain a sufficient signal-to-noise ratio. Thus, optical emitters can consume a large amount of power. Even though previous studies on phototransistors have shown that they have a high responsivity, those devices suffered from increased dark current and a longer response time.

Rather than collecting generated electron-hole pairs directly, it is possible to use the carriers to change the band bending in the device, and thereby modulate the potential and thus the output current. Theoretically, this method has the potential to overcome theoretical limitation on EQE, but in practice, it has been impossible to demonstrate that the above-mentioned method has a better performance than that of photodiodes. Furthermore, since these photodiodes are not scalable, large output capacitances are still problematic.

Consequently, it would be desirable to provide an improved phototransistor to be used in conjunction with optical interconnects.

SUMMARY OF THE INVENTION

In accordance with a preferred embodiment of the present invention, a phototransistor having a substrate, a gate, a source, a drain and a channel. The source, drain and channel are doped to be the same type of semiconductor. The substrate can be made of silicon and/or germanium. The gate can be made of either aluminum or polysilicon.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
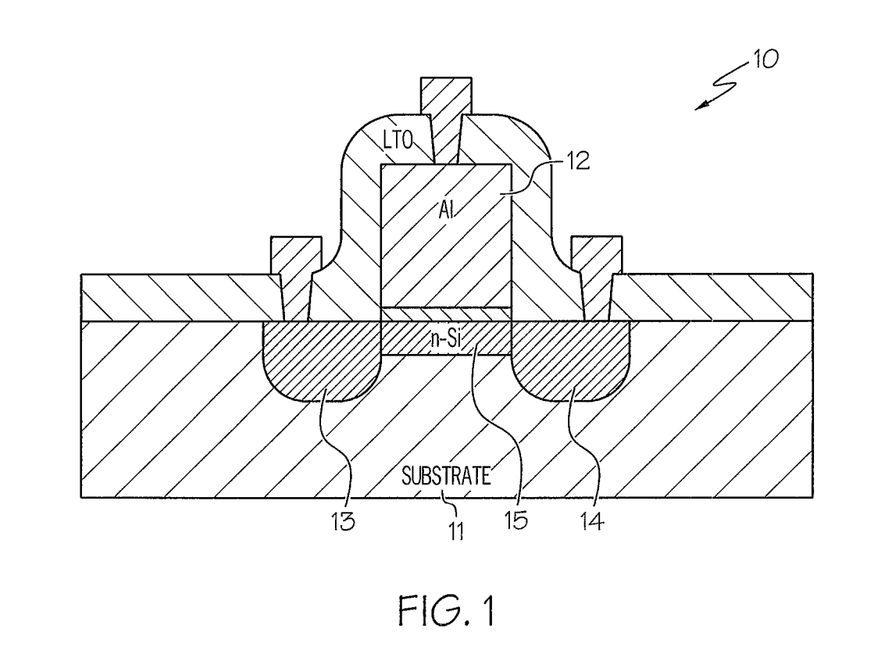
FIG. 1 is a diagram of a depletion-mode metal-oxide semiconductor field-effect transistor-based phototransistor, in accordance with a preferred embodiment of the present invention.

Referring now to the drawings, and in particular to FIG. 1, there is depicted a diagram of a depletion-mode metal-oxide semiconductor field-effect transistor (MOSFET) based phototransistor, in accordance with a preferred embodiment of the present invention. As shown, a phototransistor 10 includes a floating substrate 11, a gate 12, a source 13, a drain 14 and a channel 15. Substrate 11 is preferably made of silicon. Gate 12 is preferably made of either aluminum or polysilicon. Source 13, drain 14 and channel 15 are doped to have the same type of semiconductor (e.g., n-type in FIG. 1) while substrate 11 is doped to have the opposite type of semiconductor (e.g., p-type in FIG. 1).

Phototransistor 10 can be fabricated as follows. Initially, a p-well is formed in an n-type silicon substrate (~1 $e^{17}$ $cm^3$) (such as substrate 11 from FIG. 1) via an ion implantation with 1 $e^{14}$ $cm^{-2}$ of boron at 50 keV. A source (such as source 13 from FIG. 1) and a drain (such as drain 14 from FIG. 1) are then formed by an ion implantation with 2 $e^{15}$ $cm^{-2}$ of arsenic at 40 keV. Next, a channel (such as channel 15 from FIG. 1) is formed by an ion implantation with 2 $e^{13}$ $cm^{-2}$ of arsenic at 10 keV. The ion implantation formed an n-type channel with a peak doping density of 2 $e^{19}$ $cm^{-3}$ and a junction depth of 15 nm. Then, a layer of silicon dioxide ($SiO_2$), e.g., 7 nm thick, is thermally grown on top of the substrate, followed by a deposition of aluminum, e.g., 200 nm thick, and a dry-etching to form a gate (such as gate 12 from FIG. 1). Another layer of low-temperature oxide, such as $SiO_2$, can be deposited on the gate and the substrate in order to passivate the surface of the gate and substrate. Finally, a via etch and metallization are performed to make contacts for gate 12, source 13 and drain 14.

One main difference between phototransistor 10 and a conventional MOSFET is that channel 15 is doped to have the same type of semiconductor as source 13/drain 14. By doing so, the current is transported through an accumulation layer, not through a strong inversion layer (which is the characteristic of MOSFETs). Thus, substrate 11 and the interface between channel 15 and the gate dielectric are acting as floating gates for phototransistor 10, and the potential of the floating gate is controlled by both incident light and the potential of gate 12. In other words, the potential difference between substrate 11 (which is the same as the potential of the interface between channel 15 and the gate dielectric) and source 13 determines the current, and the potential of gate 12 is affecting the output current only through modulating the potential of the interface between channel 15 and the gate dielectric.

During operation, incident light can be absorbed in substrate 11 of phototransistor 10. In order to understand the physics of phototransistor 10, it is important to inspect its band diagram, which changes with an incident light.

With reference now to FIGS. 2a-2e, there are illustrated the progression of changes in the band diagrams for phototransistor 10 from FIG. 1 upon illumination by an incident light. The incident light can be from a laser having a wavelength of, for example, 850 nm. The x-axis of each of FIGS. 2a-2e corresponds to the dimensions of phototransistor 10 perpendicular to the surface, and the y-axis of each of FIGS. 2a-2e corresponds to energy levels.

Figure 2A:
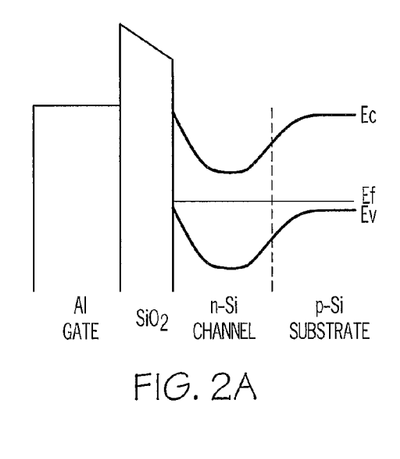
FIGS. 2a-2e illustrate the progression of changes in the band diagrams for the phototransistor from FIG. 1 upon illumination.
Figure 2B:
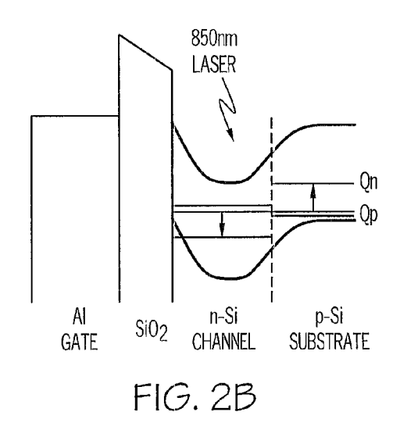
Figure 2C:
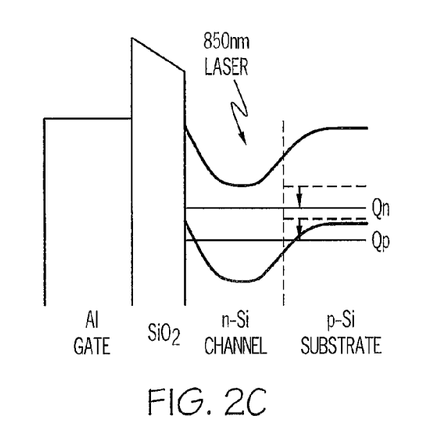
Figure 2D:
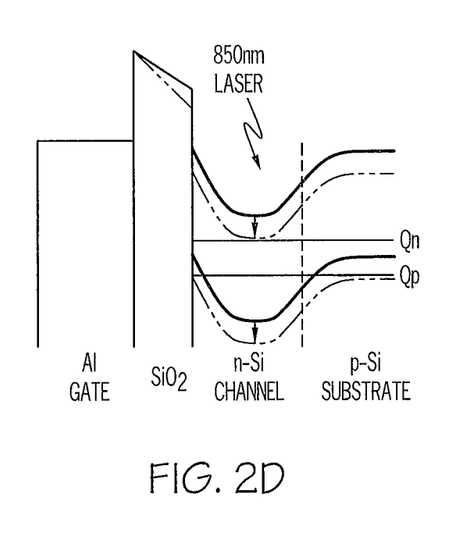
Figure 2E:
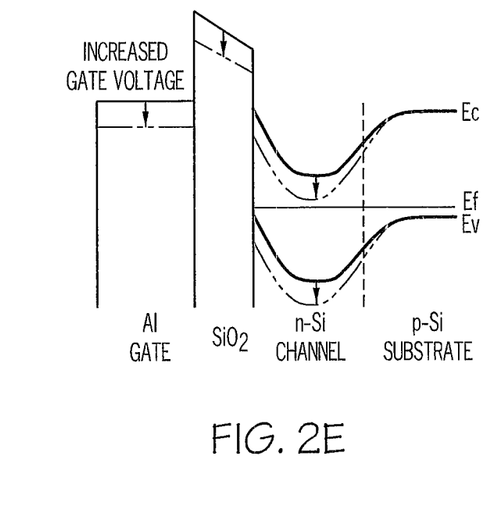

Initially, channel 15 is depleted and phototransistor 10 is in an off-state, as shown in FIG. 2a. An incident light is then absorbed in channel 15 and substrate 11. The incident light generates electron-hole pairs, and subsequently a quasi-Fermi level split in both channel 15 and substrate 11, as depicted in FIG. 2b. Because channel 15 and substrate 11 are made of the same material, the quasi-Fermi levels of both the electrons and holes need to be aligned in the steady state. In phototransistor 10, p-type substrate 11 is floating, while n-type channel 15 is connected to n-type source 13/drain 14. As a result, the quasi-Fermi levels of substrate 11 shift downward to be aligned with those of channel 15, as shown in FIG. 2c. Because of the quasi-Fermi level splits, the hole's quasi-Fermi levels at the oxide/channel interface and substrate 11 have a lower energy than that of the valence band; thus, the bands of channel 15 and substrate 11 need to shift downward, as depicted in FIG. 2d. As a result, the incident light increases the drain current by reducing band bending at channel 15. The band of channel 15 with the incident light is analogous to that with a lower gate voltage, as shown in FIG. 2e.

Because the absorption is taking place at substrate 11, the gate length of gate 12 can be scaled down without affecting the light absorbed in substrate 11. In contrast, the scaling down of a conventional photodetector would reduce responsivity because of the diffraction limit of light. The region of phototransistor 10 absorbing light (i.e., substrate) is decoupled from the active region (i.e., source, drain, channel, and gate). As a result, there is no shift in the gate voltage of gate 12 as phototransistor 10 is being scale down. In addition, the shortening of gate length via scaling down can provide advantages such as a higher transconductance and lower output capacitance due to a smaller device size.

It is possible to formulate a quantitative relationship between the incident light intensity and the effective gate voltage shift. The absorption coefficient of the 850 nm wavelength incident light in silicon ($\alpha$=5.35×10$^2$ cm$^{-1}$) is small enough that the generation rate in substrate 10 can be assumed to remain constant with respect to depth. The generation rate G in substrate 10 can be approximate as follows:

$$G = \alpha I \quad (1)$$

where I is the photon flux of incident light. Also, the recombination rate R can calculated as $$R = \frac{N_e}{\tau} \quad (2)$$

where $N_e$ and $\tau$ are the excess carrier density and carrier lifetime, respectively.

During steady state, the generation rate G needs to be equal to the recombination rate R. Thus, the excess carrier density can be expressed as:

$$N_e = \alpha \tau I \quad (3)$$

Phototransistor 10 operates within a low injection regime at which the density of the excess carriers is relatively small compared to that of the majority carriers (i.e., electrons), but larger than that of the minority carriers (i.e., holes). As a result, only the quasi-Fermi level of the hole shifts because of the excess carriers.

Quantitatively, the difference between the quasi-Fermi level of the hole ($E_{Qp}$) and the original Fermi level ($E_f$) can be expressed as:

$$E_f - E_{Qp} = \frac{kT}{q} \log_e\left(\frac{N_e + n}{n}\right) \approx \frac{kT}{q} \log_e\left(\frac{\alpha \tau I}{n}\right) \quad (4)$$

At the oxide/channel interface, the energy difference between the quasi-Fermi level of the hole and the valence band approaches zero. Thus, the shift in quasi-Fermi level at the interface is the same as that in the gate voltage of gate 12, if the voltage drop across the gate oxide layer is negligible. As a result, the gate voltage shift ($\Delta V_G$) is $$\Delta V_G \approx E_f - E_{Qp} = \frac{kT}{q} \log_e\left(\frac{\alpha \tau I}{n}\right) \approx \frac{kT}{q}\left[\log_e(I) + \log_e\left(\frac{\alpha \tau}{n}\right)\right] \quad (5)$$

From equation (5), the relationship of the intensity of light to the gate voltage shift can be formulated as $$\frac{d\Delta V_G}{d\log_e(I)} \approx \frac{kT}{q} \quad (6)$$

In sum, there is a 60 mV gate voltage shift for every decade of increment in the intensity of incident light at room temperature if there is not any non-ideal carrier recombination/transport mechanism. It is useful to examine the above-mentioned linear relationship in order to verify whether or not phototransistor 10 operates in the mechanism.

This formulation shows that the efficiency of phototransistor 10 relies on the flux of the incident light (i.e., I). This feature implies that phototransistor 10 is scalable since scaling down phototransistor 10 would not degrade the efficiency. Also, phototransistor 10 utilizes substrate 11 as a light absorber so that the diffraction limit of the incident light is not problematic.

Figure 3A:
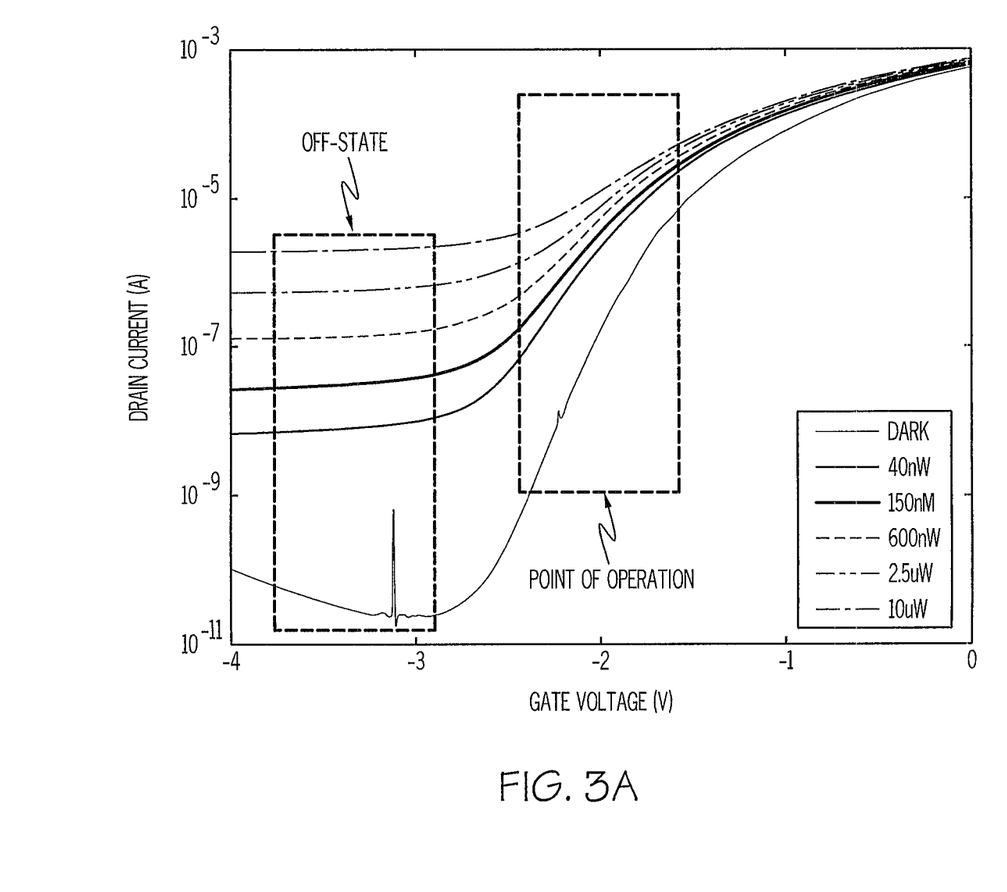
FIGS. 3a-3b are $I_D$-$V_G$ curves for the phototransistor from FIG. 1 at various light intensities.
Figure 3B:
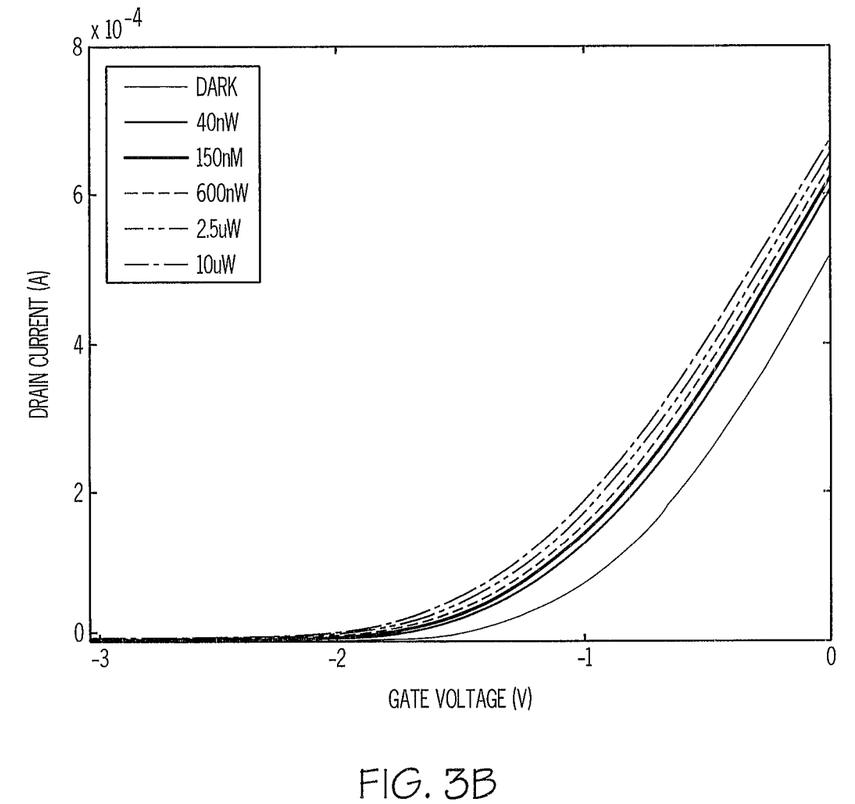

Referring now to FIGS. 3a-3b, there are depicted two $I_D$-$V_G$ curves for phototransistor 10 at various light intensities, with a semi-log scale showing in FIG. 3a and a linear scale showing in FIG. 3b. The proposed gate voltage of the operation is at the sub-threshold region. In an off-state (i.e., when channel 15 is fully depleted), phototransistor 10 operates as a conventional photodiode; the increment of the output current is due to the direct collection on electron-hole pairs, and the responsivity is below 0.1 A/W. However, in the sub-threshold region (i.e., when channel 15 is partially depleted), the shift in channel 15's bands induces the output current with the responsivity several orders of magnitude higher than 0.7 A/W, which is the theoretical limit of the conventional photodiode.

Figure 4:
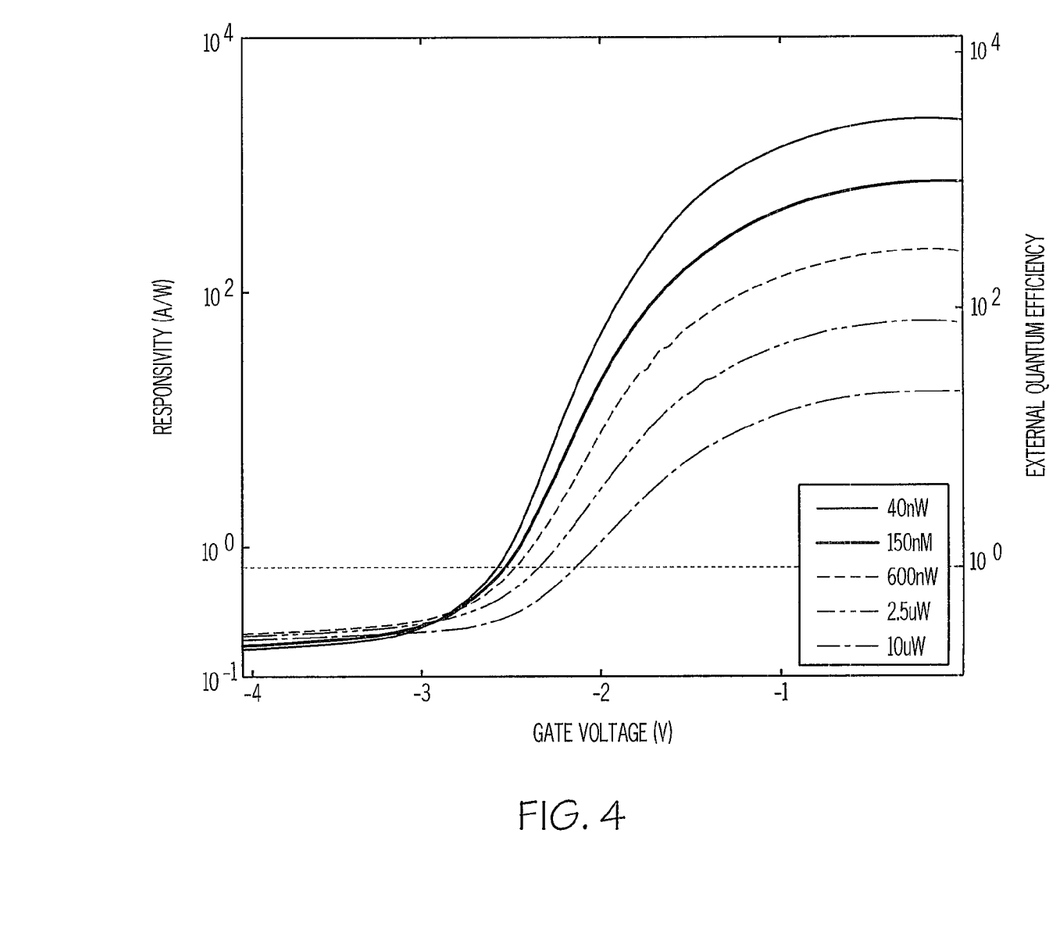
FIG. 4 shows the responsivity for the phototransistor from FIG. 1 at various light intensities.

With reference now to FIG. 4, there is illustrated the responsivity for phototransistor 10 at various light intensities. Phototransistor 10 shows a very high responsivity of over 100 A/W, or an external quantum efficiency (EQE) of over 150 at weak intensities of incident light in the subthreshold region. A linear-scale graph shows that each curve is identical in shape and only differs in x-axis position. As a result, it is possible to calculate the gate voltage shift for various intensities of the incident light.

Figure 5:
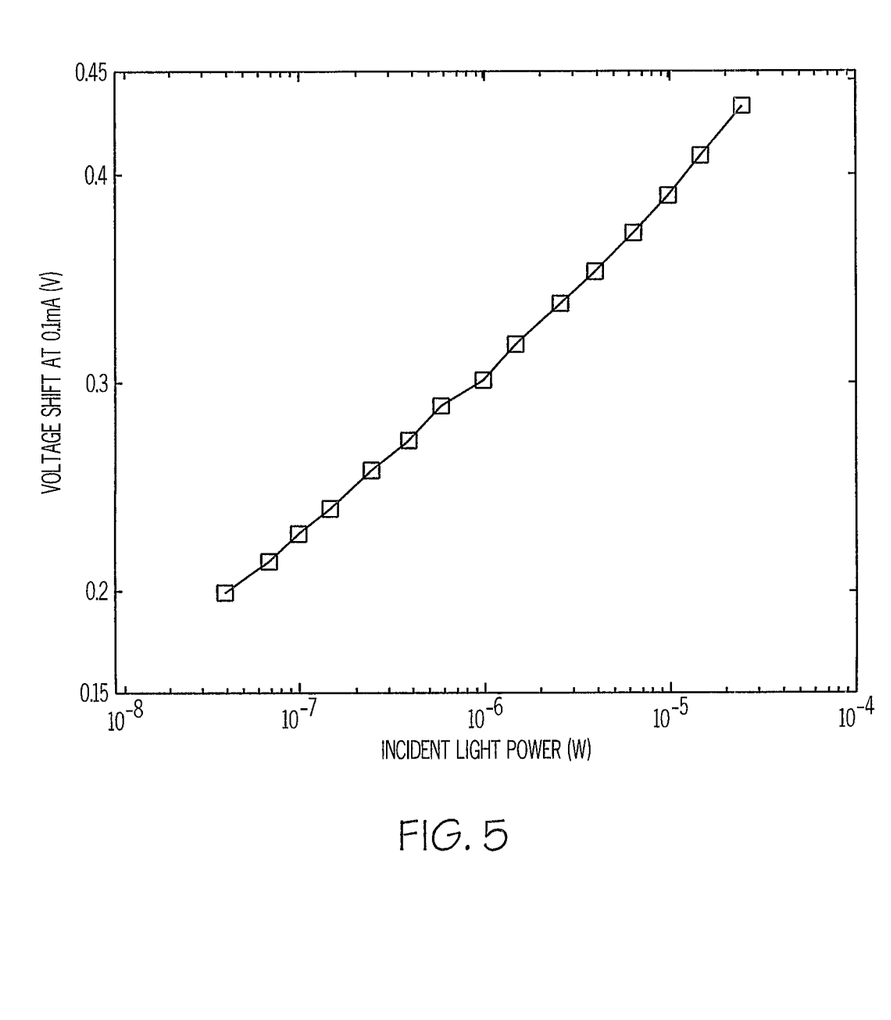
FIG. 5 depicts a plot of the gate voltage shift versus the intensity of an incident light.

Referring now to FIG. 5, there is depicted a plot of the gate voltage shift versus the intensity of an incident light. It shows a linear relationship between the logarithm of the light intensity and the gate voltage shift, as stated in equation (6). The plot of FIG. 5 also suggests a strong possibility of detecting light with small intensity, even with a few orders of magnitude less than 40 nW. Such a weak intensity of light is hard to detect with a conventional photodiode because of the large dark current associated with the diode structure. In contrast, the usage of a MOSFET structure in phototransistor 10 decreases the dark current, and phototransistor 10 is able to detect very small intensity of light.

Phototransistor 10 on a silicon substrate can detect light with wavelength shorter than near-infrared light (i.e., visible light), which is suitable for most image sensing applications. However, for optical communication applications, the wavelength of the optical signal generally falls between 1,320 nm and 1,550 nm, which is beyond the capability of phototransistor 10 on a silicon substrate. Thus, the substrate of phototransistor 10 has to be changed to, for example, germanium so that it can detect optical signals with communication wavelength. In order for the process to be compatible with the silicon complementary-metal oxide semiconductor (CMOS) processing technology, the germanium substrate can be grown on top of the silicon substrate.

Figure 6:
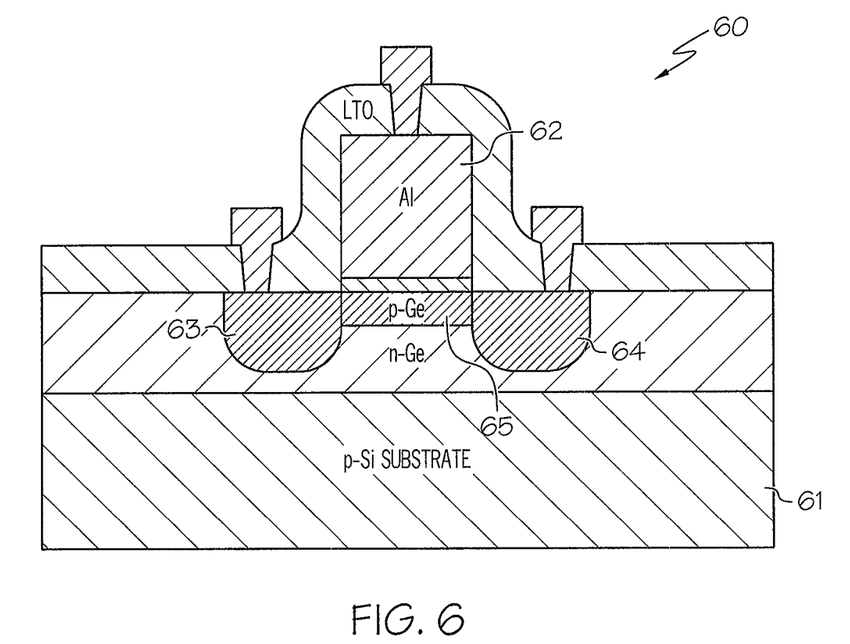
FIG. 6 shows a p-type germanium depletion-mode field-effect transistor-based phototransistor.

With reference now to FIG. 6, there is illustrated a phototransistor having a germanium/silicon substrate. As shown, a phototransitor 60 includes a substrate 61, a gate 62, a source 63, a drain 64 and a channel 65. Preferably, substrate 61 is made of silicon, and channel 65 is made of a p-type germanium because p-type germanium is a much more mature process than the n-type counterpart in terms of processing technology.

As has been described, the present invention provides an improved depletion-mode MOSFET-based photodetector with extremely high responsivity and scalability. Using the generated electron-hole pairs to modulate band bending rather than collecting these pairs directly leads to a high responsivity, while collecting light at the substrate results in the scalability. Furthermore, scaling down the dimension of the photodetector of the present invention is not only theoretically possible but also advantageous in terms of responsivity and capacitance.

The photodetector of the present invention shows possibilities of solving two of the most challenging problems with the power requirements of optical interconnects, namely, power consumption in light emitters and power consumption in receivers. The high responsivity of the photodetector of the present invention requires less optical power from a light emitter; the scalability of the photodetector of the present invention opens up the possibility of a small output capacitance, which would thereby reduce power consumption in a receiver circuit.

While the invention has been particularly shown and described with reference to a preferred embodiment, it will be understood by those skilled in the art that various changes in form and detail may be made therein without departing from the spirit and scope of the invention.

What is claimed is:

1. A phototransistor comprising:
   a p-type substrate;
   an n-type source and an n-type drain formed within said p-type substrate;
   an n-type channel, connected between said n-type source and n-type drain, is formed within said p-type substrate; and
   a gate formed above said p-type substrate such that a current, in response to an incident light at said n-type source or said n-type drain is transported through an accumulation layer formed within said one n-type only channel.

2. The phototransistor of claim 1, wherein said substrate is made of silicon.

3. The phototransistor of claim 1, wherein said substrate is made of germanium and silicon.

4. The phototransistor of claim 1, wherein said gate is made of metal.

5. The phototransistor of claim 1, wherein said gate is made of polysilicon.

6. The phototransistor of claim 1, wherein a level of said current is determined by a potential difference between said substrate and said source.

7. The phototransistor of claim 1, wherein said substrate is a floating substrate.

8. The phototransistor of claim 1, wherein said phototransistor further includes a dielectric layer between said gate and said n-type channel.

9. A phototransistor comprising:
   an n-type substrate;
   a p-type source and a p-type drain formed within said n-type substrate;
   a p-type channel, connected between said p-type source and p-type drain, is formed within said n-type substrate; and
   a gate formed above said n-type substrate such that a current, in response to an incident light at said p-type source or said p-type drain is transported through an accumulation layer formed within said one p-type only channel.

10. The phototransistor of claim 9, wherein said substrate is a floating substrate.

11. The phototransistor of claim 9, wherein said substrate is made of silicon.

12. The phototransistor of claim 9, wherein said substrate is made of germanium and silicon.

13. The phototransistor of claim 9, wherein said gate is made of metal.

14. The phototransistor of claim 9, wherein said gate is made of polysilicon.

15. The phototransistor of claim 9 wherein said phototransistor further includes a dielectric layer between said gate and said n-type channel.

16. The phototransistor of claim 9, wherein a level of said current is determined by a potential difference between said substrate and said source.

* * * * *